United States Patent [19]

Edelstein et al.

[11] Patent Number: 4,613,820

[45] Date of Patent: Sep. 23, 1986

[54] RF SHIELDED ROOM FOR NMR IMAGING SYSTEM

[75] Inventors: William A. Edelstein; David R. Eisner; Rowland W. Redington; Lowell S. Smith, all of Schenectady, N.Y.

[73] Assignee: General Electric Company, Schenectady, N.Y.

[21] Appl. No.: 597,803

[22] Filed: Apr. 6, 1984

[51] Int. Cl.[4] ............................................. G01R 33/20
[52] U.S. Cl. .................................... 324/318; 324/300
[58] Field of Search ....................... 324/300, 318–320, 324/322, 303, 316, 309

[56] References Cited

U.S. PATENT DOCUMENTS

| 4,411,270 | 10/1983 | Damadian | 324/309 |
| 4,490,675 | 12/1984 | Knuettel | 324/318 |

Primary Examiner—Michael J. Tokar
Attorney, Agent, or Firm—Geoffrey H. Krauss; James C. Davis, Jr.; Marvin Snyder

[57] ABSTRACT

A radio-frequency shielded room for a nuclear magnetic resonance imaging system has at least one electrically-conductive shield wall substantially enclosing a predetermined volume adjacent to one end of the bore formed through an imaging magnet within which bore the imaging process is carried out. The at least one wall has an aperture therethrough substantially at and in registration with the one bore end. A hollow shield member, of an electrically-conductive material, extends through the magnet bore and has a first end region periphery aligned with and substantially electrically connected to the entire periphery of the aperture in the at least one wall. A second end of hollow shield member extends at least to the remaining end of the magnet bore, where it is enclosed with an electrically-conductive cap substantially electrically connected about the entire periphery of the hollow shield member second end. The at least one wall, the hollow shield member and the second end cap form a shielded room substantially completely enclosing the volume extending through the magnet bore and adjacent to one end thereof, which volume is effectively shielded from radio frequency signals emanating from outside the enclosed volume.

20 Claims, 5 Drawing Figures

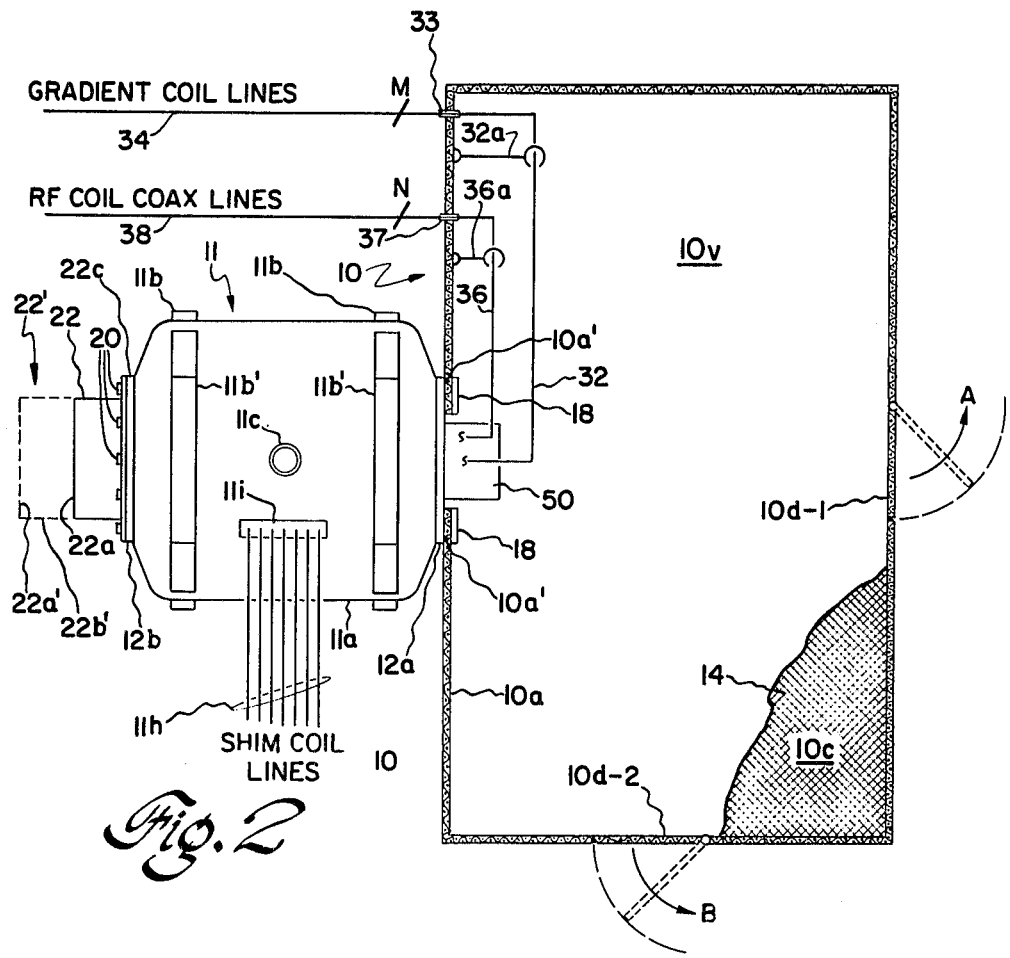
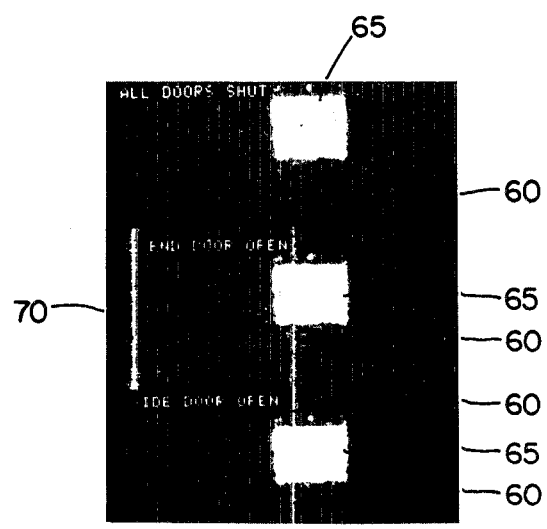
Fig. 2
Fig. 3c
Fig. 3b
Fig. 3a

RF SHIELDED ROOM FOR NMR IMAGING SYSTEM

BACKGROUND OF THE INVENTION

The present application relates to interference-suppression means for use in nuclear magnetic resonance (NMR) imaging system and, more particularly, to a novel radio-frequency (RF) shielded room for providing a region, in an NMR imaging system, in which external interference is substantially suppressed.

Nuclear magnetic resonance (NMR) imaging systems, typically capable of scanning any selected portion of the whole human body, utilize relatively large and extremely sensitive RF coils to detect the miniscule NMR response signals which emanate from body tissue. Typically, such RF coils are wound on coil forms that are at least 0.5 meter in diameter. Typical imaging systems require a relatively large static magnetic field, typically in the range from about 0.04 Tesla (T) to about 2.0 T; dependent upon the particular nuclei type being imaged and the static field magnitude, the RF signals will typically occur in the 1-100 MHz. range. This two-decade portion of the electro-magnetic spectrum abounds with relatively high-magnitude RF signals, which tend to interfere with the NMR imaging process. This is particularly true in that the relatively large RF coils and high-sensitivity receivers utilized for NMR imaging are also extremely sensitive to the extraneous RF interference signals, which may radiate, for example, from radio and television stations, electrical machinery, electronic test equipment, computers and the like. Such interference often produces undesirable effects on and/or artifacts in the NMR image. By way of example, an undesired effect can be a generally increased noise level spread throughout the image, resulting in a decrease in image contrast; and an undesired artifact can be a narrow bright streak resulting from a narrow-bandwidth interfering signal which happens to fall within, or even close to, the NMR imaging channel bandwidth.

It is highly desirable, therefore, to provide some means for shielding against the reception of interfering signals during the NMR imaging process. It is also desirable to provide such shielding means at a relatively reasonable cost. While it has been suggested to provide a shielded room about the entire NMR imaging system, the cost of such a shielded room increases generally as the square footage thereof and it is, therefore, desirable to reduce the floor area of a shielded room to be as small as possible. For state-of-the-art NMR imaging systems utilizing a superconducting magnet, a shielded room which contains the entire magnet would have to have a large enough floor area to accommodate the cryogenic dewars which must be brought into reasonably close proximity to the superconducting magnet. Further, a shielded room for use with present superconducting-magnetic NMR imaging systems must be of relatively great height, e.g. typically on the order of 14 feet, to clear the turret of the magnet and provide enough overhead room to allow transfer of cryogenic fluids thereto. A further objection to completely enclosing the NMR imaging system in a shielded room lies in the well-known requirement to shield and/or filter all wiring providing power or interconnecting electrical/electronic equipment within the shielded room to equipment outside of the shielded room, so that these wires and cables do not provide a means for entrance of potentially-interfering signals into the shielded room volume. If the entire magnet is contained within the shielded room, then electrical filters must be installed on each of the leads for: the main magnet; a plurality, typically 3, of imaging-gradient-coil sets; a plurality, typically at least 12, of shim windings which correct the static magnetic field; and other wiring. For example, one particular 1.5 T superconducting magnet requires 13 superconducting shim windings and 10 resistive shim windings, resulting in at least 25 power lines, having no utility in providing the gradient or RF signals, having to be filtered upon entrance through the imaging system shielded room. Each of the multiplicity of required electrical filters is not only expensive, but relatively difficult to design and it is extremely desirable to minimize the number of such filters.

BRIEF SUMMARY OF THE INVENTION

In accordance with the invention, a radio-frequency shielded room for a nuclear magnetic resonance imaging system having a magnetic means with a bore therethrough and within which bore the imaging process is carried out, comprises: at least one electrically-conductive shield wall substantially enclosing a predetermined volume adjacent to one end of the magnet means bore, with the at least one wall having an aperture therethrough substantially at and in registration with said one bore end; a hollow shield member, of an electrically-conductive material, extending through said magnet means bore and having a first end region having a periphery aligned with and substantially electrically connected to the entire periphery of said aperture in said at least one wall, with a second end of said hollow shield member extending at least to the remaining end of said magnet means bore; and means adjacent to said magnet means bore remaining end for capping the hollow shield member second end with an electrically-conductive portion substantially electrically connected about the entire periphery of said hollow shield member second end; said at least one wall, said hollow shield member and said capping means substantially completely enclosing a volume extending through said bore and adjacent to one end thereof, which volume is effectively shielded from radio frequency signals emanating from outside the enclosed volume.

Accordingly, it is an object of the present invention to provide a novel shielded room for use in a nuclear magnetic resonance imaging system.

This and other objects of the present invention will become apparent upon reading of the following detailed description, when considered in conjunction with the drawings.

BRIEF DESCRIPTION OF THE DRAWINGS

FIG. 2 is a plan view of the NMR imaging system magnet and shielded room structure; and FIGS. 3a-3c are three images taken with the NMR imaging system of FIGS. 1 and 2, and respectively illustrating the interference artifacts provided with one or the other of the two doors in the shielded room open, and the image provided with the complete room shield in properly closed condition.

DETAILED DESCRIPTION OF THE INVENTION

Figure 1:
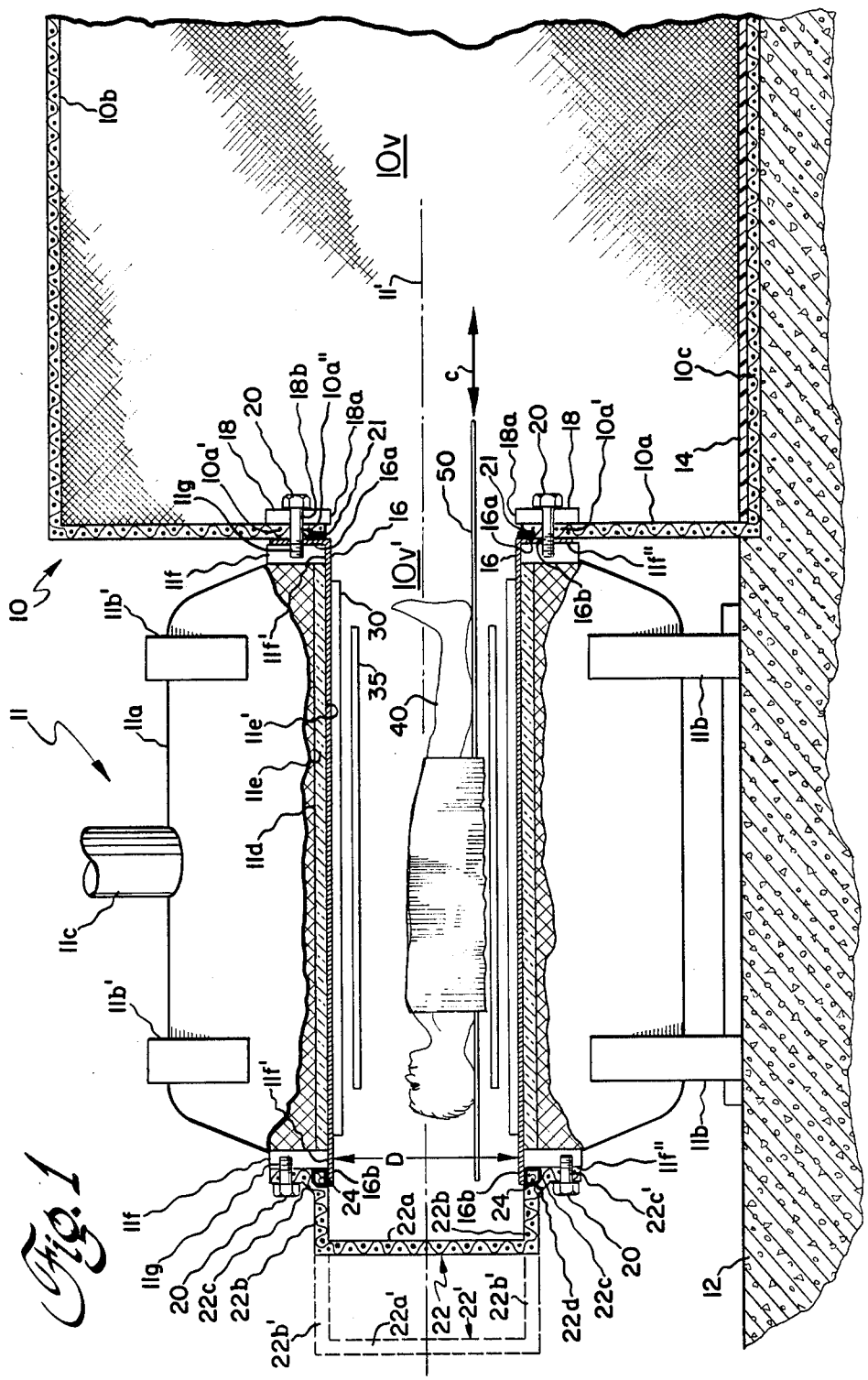
FIG. 1 is a partially-sectionalized side view of a portion of a nuclear magnetic resonance whole-body imaging system and of our novel shielded room for use therewith.

Referring initially to FIGS. 1 and 2, our novel shielded room 10 is utilized with a nuclear-magnetic-resonance (NMR) imaging system having a magnet means 11. Magnet means 11 may be of the resistive, superconductive and the like type, and is generally comprised of a plurality of coils (not shown for reasons of simplicity) disposed within an outer shell 11a, itself supported by some mounting means 11b, such as concrete supports and the like, upon a floor 12, of a material, such as concrete and the like, capable of supporting the relatively large weight of the magnet means. The magnet means may include suitable means 11b' for facilitating closure of the multipart outer shell 11a. Typically, duct means 11c enters the magnet means shell 11a, to provide at least one conduit for the main magnet coil electrical and/or coolant-carrying means. In a typical superconducting imaging magnet, the main magnetic coils are enclosed in a dual-dewar arrangement and the cryogenic coil-coolant liquids, such as liquid helium and liquid nitrogen or the like, enter through the substantially-vertical conduit 11c. Magnet means 11 is provided with an axial bore 11d. The bore may be lined with a tube 11e of an insulative, non-magnetic material, such as fiberglass and the like. The interior surface 11e' of tube 11e defines the accessible axial bore of magnet means 11. Advantageously, bore surface 11e' forms a circular cylinder, although it should be understood that bores of other cross-sectional shape can be equally as well utilized with our novel shielded room.

Each end of the magnet means is provided with one of flange plates 11f mounted substantially perpendicular to the center line 11' of the magnet means bore, and each flange plate has an aperture 11f' formed therethrough of substantially the same bore dimensions, e.g. diameter, as the bore formed by liner tube 11e. Each of flange plates 11f has a plurality of threaded apertures 11g spaced about the outwardly-facing flange plate surface 11f''.

In accordance with one aspect of the present invention, shielded room 10 is provided with at least one wall section 10a having an aperture 10a' formed therethrough with a size and at a location to provide access to the open bore of the magnet means, as defined by the inner surface 11e' of the bore liner. While it should be understood that shielded room wall 11a may comprise a single continuous surface, giving the room a spherical workroom, or first, volume portion 10v, in practice volume 10v will generally be enclosed by a plurality of substantially vertical electrically-conductive wall sections 10a, substantially continuously-joined to each other and also, along the entire top and bottom peripheries thereof, to the peripheries of a ceiling conductive section 10b and a floor conductive section 10c. The shielded room may contain one or more door means 10d, such as an end door 10d-1 and a side door 10d-2 (FIG. 2) opening outwardly in the directions of arrows A and B, respectively, or inwardly, and each forming, when closed, an essentially conductive portion of the wall portion 10a in which each is set. Workroom volume 10v may have flooring means 14, of conductive or non-conductive material, installed above the conductive shield floor 10c, as desired. Air circulation means, shielded room lighting means and the like, are contemplated, although not shown, and the means for shielding and/or filtering the conduits carrying air, lighting and-/or instrumentation power and the like into the shielded workroom volume 10v are well known to the art. It will thus be seen that the main shielded workroom volume 10v forms, when the access door means 10d are closed, a radio-frequency shielded region broken only by the aperture 10a' adjacent to one flange plate 11f of the magnet means, and with the shielded workroom volume 10v alongside, but not enclosing any portion of, the magnet means 11.

In accordance with another aspect of the invention, the shielded workroom volume 10v has an imaging volume extension 10v' including the axial bore of magnet means 11. A hollow shield member 16 of electrically-conductive and essentially non-magnetic material, advantageously having substantially the same cross section as the bore cross section formed by the interior surface 11e' of the magnet means bore liner 11e, is placed substantially in abutment with the bore liner surface 11e' along the entire length of the bore. Illustratively, for a cylindrical bore, member 16 is a hollow tube of thin stainless steel. Hollow shield member 16 further includes a first end flange portion 16a extending radially outward from tube 16 and lying in abutment with the exterior surface 11f'' of that magnet means flange plate closest to shielded room wall section 10a having the aperture 10a' therein. First end flange portion 16a is continuously joined in electrical connection to hollow shield member 16 and is, as illustrated, of annular shape having an outer diameter and thickness sufficient to be sandwiched between the flange plate exterior surface 11f'' and the exterior surface of the conductive shielded room wall section 10a about the periphery of aperture 10a'. An annular plate 18, having an interior aperture 18a of at least the bore diameter D, is placed upon the interior surface of wall section 10a, about the periphery of the aperture 10a' therein. Each of a plurality of fastening means 20 extends through one of apertures 18b in plate 18, thence through aligned apertures 10a'' (in the shield room wall) and apertures 16b (in the radially-extended shield member first end flange portion 16a) and enter threaded apertures 11g in the flange plate. Upon tightening of fastening means 20, plate 18 presses a conductive ring 21, of metallic wool material and the like, against the conductive wall portion 10a, substantially about the entire periphery of the aperture 10a' therein, and also presses the conductive ring 21 against the exterior periphery of the radially-disposed shield member first end flange portion 16a, completing an electrically-conductive connection therebetween substantially about the periphery of shield room wall aperture 10a'.

In accordance with another aspect of the present invention, a shield capping means 22 electrically closes off the end of the hollow-bore-lining shield member 16 at the second end 16b thereof, opposite shielded workroom volume 10v. Capping means 22 may be a disc of electrically conductive material having apertures therein for passing additional fastening means 20 through another radially-extended hollow shield member end flange portion, similar to flange portion 16a, to complete the radio-frequency-shielded enclosure of volumes 10v and 10v'. As illustrated, end shield capping means 22 has a vertically-disposed portion 22a, having a periphery in the same shape as that of bore-lining hollow shield member 16 (which has a second end portion 16b thereof extending beyond the exterior surface 11f'' of the magnet means flange plate furthest from shielded room volume 10v); in the illustration, the bore is of substantially circular cross section and portion 22a is a disc-shaped member of an electrically-conductive, substantially non-magnetic material. The periphery of portion 22a is conductively joined to a tube portion 22b having a radially-outward-extending annular flange portion 22c at the opposite end thereof. Advantageously, both portions 22a and 22b of cap means 22 are fabricated of a conductive mesh material, allowing light and ventilation to enter the bore volume 10v' for the comfort of a patient 50, when temporarily situated within imaging volume 10v' for diagnostic scanning purposes, and also to provide an egress for air exiting from workroom volume 10v. The capping means wall portion 22b may be of any desired length, as indicated by the extended wall portion 22b' conductively attached to mesh disc portion 22a' to form an end shield means 22' (shown in broken line) having a greater "head end" volume than the end cap means 22 (shown in solid line). Conductive end capping means 22 is conductively connected to the second end 16a of the conductive shield member 16 by any suitable means. In the illustrated embodiment, the radially-outward-extending cap flange portion 22c includes a channel formation 22d about the interior rim thereof, which channel contains a ring 24 of a highly-conductive metallic wool material or the like. The cross-sectional dimension of each portion of conductive wool ring 24 is such that the wool is compressed when capping means 22 is placed over the shield member extension portion 16b and the flange portion 20c is fastened against the flange plate surface, as by fastening means 20 extending through apertures 22c' in the cap flange and into registered apertures 11g in the exterior surface 11f' of the magnet means flange plate exterior surface. The compressed conductive wool ring 24 thus expands and forms a low impedance contact between shield member second end portion 16b and conductive end capping means 22.

It will be seen that the conductive shield member 16, in electrical connection with the at least one wall portion 10a enclosing volume 10v at one end of the magnet means and in electrical connection with capping means 22 at the other end of the magnet means bore, provides an essentially continuous radio frequency shielded extension enclosing patient volume 10v' and extending from the shielded workroom volume 10v. The shielded room volumes 10v and 10v' do not enclose any portion of the magnet means; the coolant and power lines entering the magnet means, e.g. through overhead conduit 11c, or the magnetic shim coil line conductors 11h entering the magnet means through an exterior port 11i, are all outside of the RF shielded room 10.

For proper NMR imaging of a patient, imaging gradient coil means 30 and imaging radio frequency coil means 35 are required to be in place about the patient 40, who is moved into imaging volume 10v' upon suitable support means 50, movable in the direction of arrows C. Imaging gradient coil means 30 typically lies external to RF imaging coil means 35 and both means 30 and 35 will typically have cross-sectional dimensions equal to at least one-half of the diameter D of the magnet bore diameter, to allow the greatest freedom in patient access and positioning. The variable currents required for establishing the instantaneous gradient field magnitudes are provided to gradient coil means 30 by a set of shielded gradient coil lines 32, which extend from gradient coil means 30 into workroom volume 10v. As a multiplicity M of individual gradient coil power lines are actually required, it is preferable that all of the M lines be bundled together and that the bundle 32 be shielded, as by a shield 32' connected to the shield room wall 10a, along the greatest extent possible of the run of these lines within shielded volume 10v, and that each line pass through an associated one of a like plurality of filtering means 33 in the shield room wall 10a. Similarly, the RF coil means 35 requires at least one connection line to the transmitter/receiver equipment (itself located external to the shield room internal volumes 10v and 10v'); advantageously, a single RF coil means can often be utilized, with a single coaxial cable 36 connecting coil means 35 to an external transmit/receive switching means (not shown). Thus, the RF coil coaxial line (or a small plurality N of different lines, as required) extends from coil means 35 through working volume 10v to bulkhead coaxial connector means 37 passing through shield room wall 10a. As the coaxial line(s) 36 each have their own coaxial shield, each of the coaxial cable shields is connected in continuity with the shield wall; this shield connection 36a is typically an integral part of the coaxial bulkhead connection means 37 utilized. Thus, only the signals actually being required within the shielded room must be brought in through filtering means 33 or coaxial bulkhead connector means 37 and the cables carrying these minimal number of required signals are themselves shielded to maintain the shielding integrity of the RF shielded room of our invention.

The effectiveness of our novel RF shielded room for use in a nuclear magnetic resonance imaging system, is illustrated by reference to FIGS. 3a–3c, which contain three exposures of an imaging "phantom" taken with an imaging RF coil 35 and gradient means 30 positioned in a 1 meter diameter bore of a 1.5 T superconducting NMR imaging magnet means. The bore shield member 16 is fabricated of thin, e.g. 50 micron thick, stainless steel sheet. A knitted wire mesh gasket 24, such as available from Tecknit Corp., was utilized for forming the contact between the stainless steel sheet extension portion 16b and the mesh end capping means 22. As illustrated in FIG. 3a, in a shielded room 10 having a workroom volume 10v with a height of about 8 feet and floor dimensions of about 10 feet by 11 feet, breaking of the RF shielding integrity by opening only side door 10d-2 provides a bright, vertical streak 60 extending through the desired image 65 of the "phantom" sample, which streak 60 is due to an interfering signal close to the NMR carrier frequency signal, and is thought to represent interference from 60 Hz. or 120 Hz. radiation from external lighting and the like entering through door 10d-2. In the center image of FIG. 3b, taken with only end door 10d-1 open, vertical interference line 60 is again apparent, running through the "phantom" sample image 65; an additional interference line 70, to the left of the "phantom" sample image, and due to an interfering RF signal somewhat removed from the NMR carrier signal frequency, is seen. In FIG. 3c, taken with both doors 10d closed, it can be seen that only the "phantom" sample image 65 appears and that the interference artifact lines 60 and 70 have been effectively removed by the shielded room of our invention.

While one presently preferred embodiment of our novel shielded room for use in a nuclear magnetic resonance imaging system has been described in detail herein, many modifications and variations will now become apparent to those skilled in the art. It is our intent, therefore, to be limited only by the scope of the appending claims and not by the particular details and instrumentalities presented by way of explanation herein of a presently preferred embodiment.

What is claimed is:

1. A radio-frequency (RF) shielded room for use in a nuclear-magnetic-resonance (NMR) imaging system having magnet means having a bore therethrough and having first and second opposed surfaces respectively at the respective opposite ends of said magnet means bore, comprising:

at least one electrically-conductive shield wall means for substantially enclosing a workroom volume adjacent to said magnet means bore first end without enclosing any portion of the bore of said magnet means, said at least one wall means having an aperture formed through at least a portion thereof, said aperture being substantially in registration with, and adjacent to, said magnet means bore first end; and electrically-conductive means, extending at least partly through said magnet means bore from said first end toward said second end and conductively joined to the periphery of said wall means aperture, for substantially enclosing an imaging volume extending at least partly through said magnet means bore and joined to said workroom volume to form a unitary volume of the RF shielded room.

2. The shielded room of claim 1, wherein said imaging volume enclosing means comprises:

a hollow shield member extending through said magnet means bore and having a first end portion conductively secured to said at least one wall means about the periphery of said wall means aperture, and a second end portion, opposite said first end portion; and capping means for conductively contacting said hollow shield member second end portion and conductively closing the hollow bore thereof at a point adjacent to said bore second end.

3. The shielded room of claim 2, wherein said hollow shield member is fabricated of a tube of electrically-conductive material.

4. The shielded room of claim 3, wherein said tube has a wall thickness of about 50 microns.

5. The shielded room of claim 4, wherein said tube is fabricated of stainless steel.

6. The shielded room of claim 3, wherein said tube has a substantially circular cross section.

7. The shielded room of claim 2, wherein said hollow shield member first end portion comprises a flange portion extending outward from the periphery of said hollow shield member first end.

8. The shielded room of claim 7, wherein said shield member first end portion further comprises a conductive metallic ring member disposed substantially in abutment with portions of said shield member first end portion flange and said at least one wall means about the periphery of the aperture formed through said at least one wall means.

9. The shielded room of claim 8, further comprising means for securing said shield member first end flange and said ring member to said at least one wall means about the periphery of said aperture therein.

10. The shielded room of claim 9, wherein said at least one wall means includes: an electrically-conductive wall portion at least about said aperture periphery, said wall portion having an interior surface and an exterior surface substantially in electrically-conductive contact with said ring member and said flange; and said fastening means includes: a member in abutment with said wall portion interior surface and having an aperture therethrough in registration with said wall means aperture; and a plurality of means for pressing said member toward said magnet means first end to secure said flange, said ring member and said wall portion exterior surface in essentially electrically-conductive abutment.

11. The shielded room of claim 10, wherein each of said plurality of pressing means comprises a member received and held by an associated formation formed into said magnet means about the periphery of the first end of the bore therein.

12. The shielded room of claim 2, wherein said hollow shield member second end extends beyond the plane of said magnet means bore second end, and said capping means comprises an electrically-conductive capping member formed to enclose said hollow shield member second end portion, said capping member having a flange portion extending outward of said shield member second end portion when said capping means is placed adjacent to said bore second end; and means for forming an electrically-conductive contact between said capping member flange portion and said shield member second end portion.

13. The shielded room of claim 12, wherein said contact forming means comprises a ring member of an electrically-conductive wool material, said capping member flange portion containing a formation for receiving said ring member and for pressing the conductive wool material thereof against both said shield member second end portion and said capping member flange portion when said capping means is positioned over said shield member second end portion.

14. The shielded room of claim 12, wherein said capping means comprises a mesh member having a multiplicity of apertures therein to permit the passage of light and air through said capping means.

15. The shielded room of claim 14, wherein air introduced into said workroom volume exits therefrom through said shield member and said capping means mesh member to ventilate at least said imaging volume.

16. The shielded room of claim 1, wherein a radio-frequency imaging coil means is positioned within the shielded imaging volume within said magnet means bore and has at least one coaxial cable means attached thereto for connection to a radio-frequency portion of the imaging system; said shielded room further comprising coaxial connector means for passing each one of said at least one coaxial cable means through said at least one wall means.

17. The shielded room of claim 16, wherein said coaxial connector means electrically connects the outer shield of each of said coaxial cable means to said electrically-conductive wall means.

18. The shielded room of claim 1, wherein at least one gradient coil means is positioned within the shielded imaging volume within said magnet means bore and has a plurality of gradient coil line means attached thereto for connection to said imaging system; said shielded room further comprising a like plurality of line filter means each for filtering an associated gradient coil line means passing through said at least one wall means.

19. The shielded room of claim 18, wherein each of said gradient coil line means is enclosed by a shield connected to said wall means.

20. The shielded room of claim 19, wherein all of said gradient coil line means are enclosed within one unitary shield.

* * * * *